(12) United States Patent
Yasuda et al.

(10) Patent No.: US 8,232,838 B2
(45) Date of Patent: Jul. 31, 2012

(54) AUDIO DROPOUT AMPLIFIER

(75) Inventors: Katsuhiro Yasuda, Kanagawa (JP);
Hiroyuki Tsurumi, Kanagawa (JP);
Yuki Sato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 12/969,773

(22) Filed: Dec. 16, 2010

(65) Prior Publication Data

US 2011/0193631 A1 Aug. 11, 2011

(30) Foreign Application Priority Data

Feb. 5, 2010 (JP) ................................. 2010-24244
Sep. 24, 2010 (JP) ................................. 2010-213547

(51) Int. Cl.
*H03F 1/14* (2006.01)
(52) U.S. Cl. ........................................................ 330/51
(58) Field of Classification Search .................... 330/51; 381/94.5, 120
See application file for complete search history.

(56) References Cited

U.S. PATENT DOCUMENTS

2005/0100177 A1* 5/2005 Lee ............................. 381/94.5

FOREIGN PATENT DOCUMENTS

| JP | 03283804 | 12/1991 |
| JP | 06104664 | 4/1994 |
| JP | 2002135059 | 5/2002 |

* cited by examiner

*Primary Examiner* — Steven J Mottola
(74) *Attorney, Agent, or Firm* — Turocy & Watson, LLP

(57) ABSTRACT

According to embodiments, in a case that a source voltage is lowered and a potential difference between the source voltage and a ripple terminal voltage is below a constant potential difference, the ripple terminal voltage is lowered until the ripple terminal voltage reaches a first threshold value when a lowered value of the source voltage is equal to or larger than a predetermined voltage that exceeds the first threshold value by the constant potential difference, and the ripple terminal voltage is lowered until the ripple terminal voltage reaches a second threshold value smaller than the first threshold value when the lowered value of the source voltage is below the predetermined voltage.

20 Claims, 11 Drawing Sheets

US 8,232,838 B2

AUDIO DROPOUT AMPLIFIER

CROSS-REFERENCE TO RELATED APPLICATIONS

This application is based upon and claims the benefit of priority from the prior Japanese Patent Application No. 2010-24244, filed on Feb. 5, 2010 and the prior Japanese Patent Application No. 2010-213547, filed on Sep. 24, 2010; the entire contents all of which are incorporated herein by reference.

FIELD

The present embodiment generally relates to an amplifier.

BACKGROUND

In a power amplifier for a car audio system having a battery as a power source, a reference potential of an input signal is biased with direct-current and an input signal source and a differential input circuit are separated in a direct-current manner by an input coupling capacitor.

Meanwhile, battery voltage for a car is to be in an instantaneous-drop voltage state as instantaneously dropping from a steady state of 12 V due to much flow of load current for starting operation of various instruments at the time of engine starting, for example. At that time, fluctuation of the direct-current bias occurs at the power amplifier driven by the battery due to charge/discharge electric current transiently flowing through the input coupling capacitor. The fluctuation of the direct-current bias generates raspy pop noise.

With a power amplifier in the related art, in order not to generate such pop noise, fluctuation of the direct-current bias has been compensated by connecting an AC coupling capacitor which is charged and discharged at the same timing with an input coupling capacitor between a reference side input of a differential input circuit and a grand potential.

Here, when the battery voltage is in an instantaneous-drop voltage state and voltage required for normal operation of the differential input circuit (i.e., headroom voltage) cannot be ensured, output operation of the power amplifier is to be unstable. Accordingly, a power amplifier in the related art is to be in a non-operable state when the battery voltage is in the instantaneous-drop voltage state. Therefore, there has been a problem of occurrence of an audio dropout.

Particularly, since a system of idling stop (i.e., of engine stop) when a car is stopped is becoming popular due to a recent trend of ecology, the audio dropout has been occurring frequently due to frequent occurrence of an instantaneous drop of the battery voltage.

DETAILED DESCRIPTION

According to embodiments, an amplifier circuit to support a differential input, a ripple discharge circuit to lower ripple terminal voltage for generating reference voltage of the amplifier circuit based on source voltage of the amplifier circuit, and a ripple control circuit to control discharge timing by the ripple discharge circuit based on potential difference between the source voltage and the ripple terminal voltage are included. In a case that the source voltage is lowered and the potential difference between the source voltage and the ripple terminal voltage is below a constant potential difference, the ripple terminal voltage is lowered until the ripple terminal voltage reaches a first threshold value when a lowered value of the source voltage is equal to or larger than a predetermined voltage that exceeds the first threshold value by the constant potential difference, and the ripple terminal voltage is lowered until the ripple terminal voltage reaches a second threshold value smaller than the first threshold value when the lowered value of the source voltage is below the predetermined voltage.

Exemplary embodiments of an amplifier will be explained below in detail with reference to the accompanying drawings. The present invention is not limited to the following embodiments.

(First Embodiment)

Figure 1:
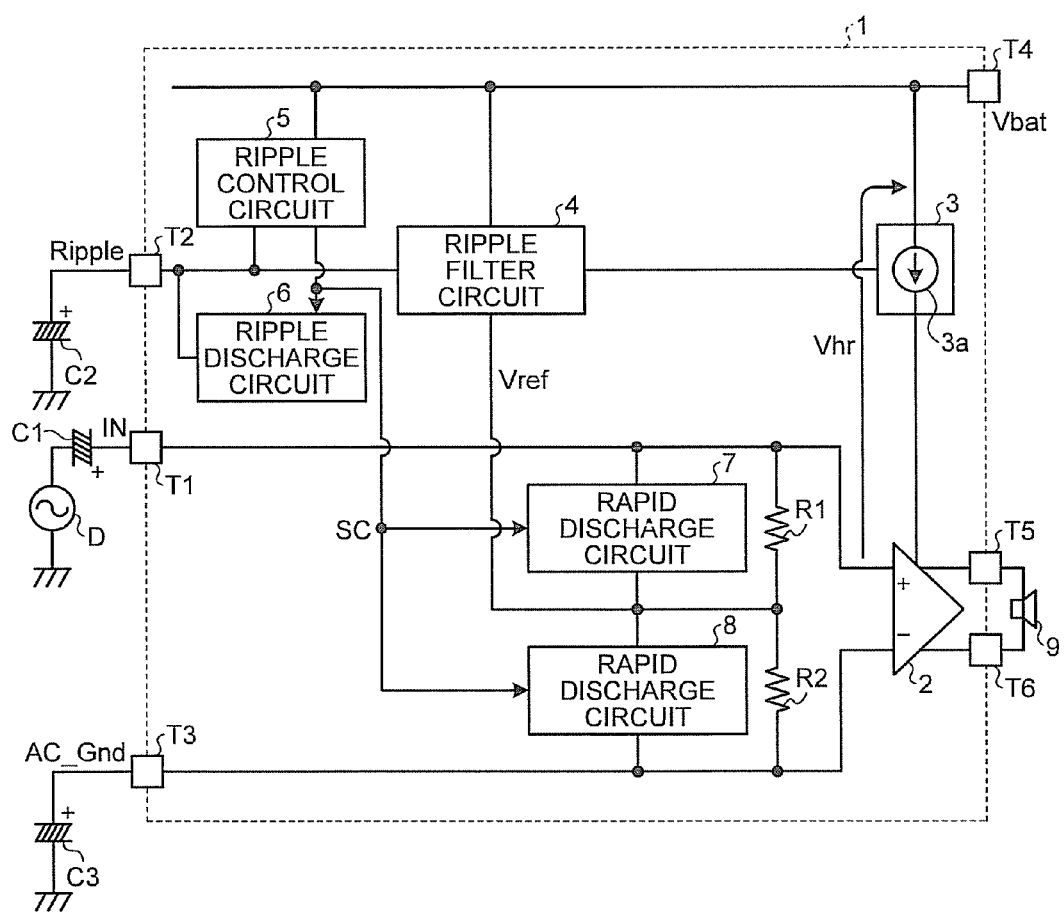
FIG. 1 is a block diagram which illustrates a schematic configuration of an amplifier according to a first embodiment.

FIG. 1 is a block diagram illustrating a schematic configuration of an amplifier according to the first embodiment.

As illustrated in FIG. 1, the amplifier is provided with an amplifier circuit 2 capable of supporting differential input. Here, the amplifier circuit 2, a bias circuit 3, a ripple filter circuit 4, a ripple control circuit 5, a ripple discharge circuit 6 and rapid discharge circuits 7, 8 may be formed in a semiconductor chip 1.

Then, an input terminal T1 and a ground terminal T3 are arranged at an input side of the amplifier circuit 2. Output terminals T5, T6 are arranged at an output side of the amplifier circuit 2. Here, a power amplifier to perform push-pull outputting corresponding to differential input may be adopted as the amplifier circuit 2. Then, the input terminal T1 is connected to an input signal source D via an input coupling capacitor C1. The ground terminal T3 is grounded via an AC coupling capacitor C3. Further, a speaker 9 is connected between the output terminals T5, T6. A series circuit of resistances R1, R2 is connected between the input terminal T1 and the ground terminal T3. A reference voltage Vref generated at the ripple filter circuit 4 is input to the connection point of the resistances R1, R2.

Further, the amplifier includes a ripple capacitor C2, the ripple filter circuit 4, the ripple control circuit 5, the ripple discharge circuit 6 and the rapid discharge circuits 7, 8. Here, the ripple capacitor C2 is capable of accumulating charges based on source voltage Vbat supplied via a source terminal T4. A ripple terminal T2 to output ripple terminal voltage Ripple is arranged to the ripple capacitor C2. In the case that the amplifier is utilized as a power amplifier for a car audio system, battery voltage may be utilized as the source voltage Vbat. Moreover, the ripple terminal voltage Ripple is a voltage to be a reference of the amplifier generated from the source voltage Vbat.

The ripple filter circuit 4 is capable of generating reference voltage Vref based on the ripple terminal voltage Ripple of the ripple capacitor C2. The ripple discharge circuit 6 is capable of discharging charges accumulated at the ripple capacitor C2 based on a control signal SC output from the ripple control circuit 5. The rapid discharge circuit 7 is capable of discharging charges accumulated at the input coupling capacitor C1 based on the control signal SC output from the ripple control circuit 5. The rapid discharge circuit 8 is capable of discharging charges accumulated at the AC coupling capacitor C3 based on the control signal SC output from the ripple control circuit 5.

The ripple control circuit 5 is capable of controlling timing of discharge by the ripple discharge circuit 6 and the rapid discharge circuits 7, 8 based on potential difference between the source voltage Vbat and the ripple terminal voltage Ripple.

Further, the amplifier includes the bias circuit 3 to generate bias to operate the amplifier circuit 2. The bias circuit 3 is provided with a current source 3a. The bias circuit 3 is capable of generating the bias to operate the amplifier circuit 2 when the ripple terminal voltage Ripple exceeds a threshold value and putting the amplifier circuit into a non-operation state when the ripple terminal voltage Ripple becomes equal to or smaller than the threshold value.

Figure 2:
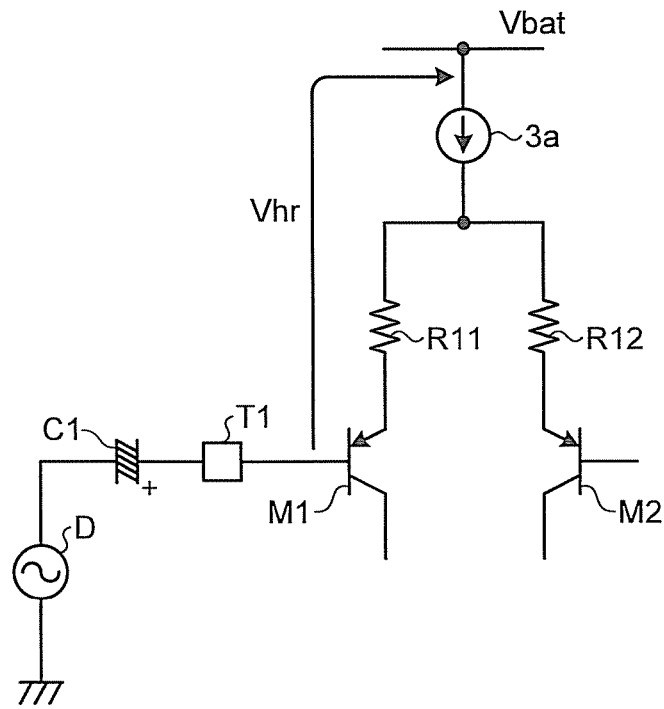
FIG. 2 is an explanatory view for definition of headroom voltage of a differential input circuit.

FIG. 2 is an explanatory view for definition of headroom voltage of a differential input circuit.

As illustrated in FIG. 2, the amplifier circuit 2 includes the differential input circuit and the differential input circuit includes bipolar transistors M1, M2. The base of the bipolar transistor M1 may be used as a plus-input of the amplifier circuit 2. The base of the bipolar transistor M2 may be used as a minus-input of the amplifier circuit 2. That is, the base of the bipolar transistor M1 is connected to the input terminal T1 and the base of the bipolar transistor M2 is connected to the ground terminal T3. Then, the emitter of the bipolar transistor M1 is connected to the current source 3a via a resistance R11 and the emitter of the bipolar transistor M2 is connected to the current source 3a via a resistance R12.

Then, the source voltage Vbat is supplied to the current source 3a. The current generated at the current source 3a is supplied to the bipolar transistors Ml, M2 respectively via the resistances R11, R12. Here, the amplifier circuit 2 has headroom voltage Vhr. When the source voltage Vbat instantaneously drops to be in an instantaneous-drop voltage state, the headroom voltage Vhr cannot be ensured and output operation of the amplifier circuit 2 is to be unstable. Here, it is known that battery voltage for a car is to be in the instantaneous-drop voltage state from a steady state of 12 V due to much flow of load current for starting operation of various instruments at the time of engine starting, for example.

Then, the ripple capacitor C2 is charged and discharged based on the source voltage Vbat. The ripple terminal voltage Ripple is generated based on the charges accumulated at the ripple capacitor C2. The reference voltage Vref is generated from the ripple terminal voltage Ripple at the ripple filter circuit 4 and supplied to the connection point of the resistances R1, R2 and the rapid discharge circuits 7, 8.

Further, the input coupling capacitor C1 is charged and discharged corresponding to the direct-current bias applied to the input terminal T1. Due to charging and discharging of the AC coupling capacitor C3 at the same timing with the input coupling capacitor C1, fluctuation of the direct-current bias is compensated.

Further, the source voltage Vbat and the ripple terminal voltage Ripple are supervised at the ripple control circuit 5. When the source voltage Vbat is lowered and the potential difference between the source voltage Vbat and the ripple terminal voltage Ripple reaches a predetermined value (headroom voltage Vhr), the control signal SC is output to the ripple discharge circuit 6 and the rapid discharge circuits 7, 8. Then, the input coupling capacitor Cl, the AC coupling capacitor C3 and the ripple capacitor C2 are discharged. Here, the predetermined value may be set to be the headroom voltage Vhr of the amplifier circuit 2.

When the source voltage Vbat exceeds a constant level Vth3, the ripple control circuit 5 may discharge the input coupling capacitor C1, the AC coupling capacitor C3 and the ripple capacitor C2 until the ripple terminal voltage Ripple reaches a threshold value Vth1. Further, when the source voltage Vbat is equal to or lower than the constant level Vth3, the ripple control circuit 5 may discharge the input coupling capacitor C1, the AC coupling capacitor C3 and the ripple capacitor C2 until the ripple terminal voltage Ripple reaches a threshold value Vth2.

Here, the threshold value Vth2 may be set to be smaller than the threshold value Vth1. Further, the threshold value Vth1 may be set at a value with which the amplifier circuit 2 is operable. The threshold value Vth2 may be set at a value with which the amplifier circuit 2 is to be non-operable. The constant level Vth3 may be set at the minimum value of the source voltage Vbat with which the amplifier circuit 2 is operable. The level Vth3 is required to satisfy the relation of Vth3≧Vth1+Vhr.

Here, when the source voltage Vbat is lowered and the potential difference between the source voltage Vbat and the ripple terminal voltage Ripple reaches a predetermined value (headroom voltage Vhr) or lower, the source voltage Vbat can be determined as being in the instantaneous-drop voltage state. In the case that the source voltage Vbat is in the instantaneous-drop voltage state, the operation point of the amplifier circuit 2 can be lowered and the direct-current bias of the input of the amplifier circuit 2 can be lowered as well by discharging the input coupling capacitor Cl, the AC coupling capacitor C3 and the ripple capacitor C2.

In the case that the source voltage Vbat is lowered and the potential difference between the source voltage Vbat and the ripple terminal voltage Ripple reaches the predetermined value (headroom voltage Vhr) or lower, when the lowered value of the source voltage Vbat is not below the constant level Vth3, the headroom voltage Vhr of the amplifier circuit 2 can be ensured while maintaining the amplifier circuit 2 operable by discharging the input coupling capacitor C1, the AC coupling capacitor C3 and the ripple capacitor C2 until the ripple terminal voltage Ripple reaches the threshold value Vth1.

On the other hand, in the case that the source voltage Vbat is lowered and the potential difference between the source voltage Vbat and the ripple terminal voltage Ripple reaches the predetermined value (headroom voltage Vhr) or lower, when the lowered value of the source voltage Vbat is below the constant level Vth3, the amplifier circuit 2 can be made in a non-operable state by discharging the input coupling capacitor C1, the AC coupling capacitor C3, and the ripple capacitor C2 until the ripple terminal voltage Ripple reaches the threshold value Vth2.

Figure 3:
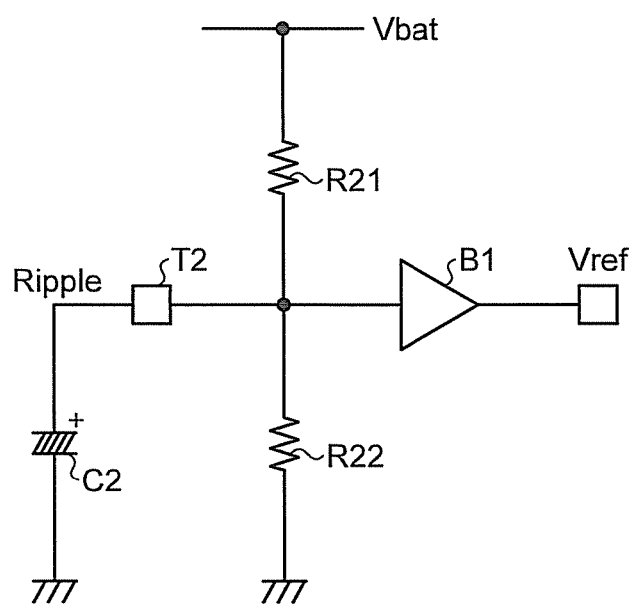
FIG. 3 is a circuit diagram which illustrates a schematic configuration of a ripple filter circuit of FIG. 1.

FIG. 3 is a circuit diagram illustrating a schematic configuration of a ripple filter circuit of FIG. 1.

As illustrated in FIG. 3, the ripple filter circuit 4 includes a buffer B1 and resistances R21, R22. Here, the resistances R21, R22 are connected serially each other. The connection point of the resistances R21, R22 is connected to the ripple terminal T2 and an input terminal of the buffer B1. The source voltage Vbat is divided by the resistances R21, R22. By supplying the divided voltage to the ripple terminal T2, charges are accumulated at the ripple capacitor C2. Then, by inputting the ripple terminal voltage Ripple of the ripple capacitor C2 to the buffer B1, the reference voltage Vref is output from the buffer B1.

Figure 4:
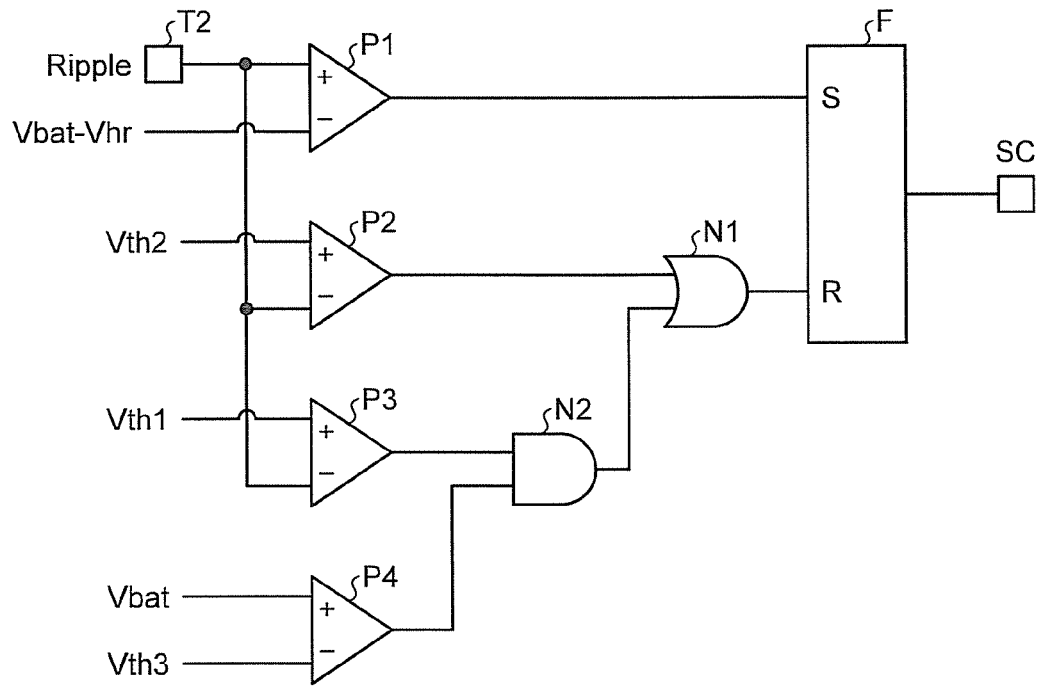
FIG. 4 is a circuit diagram which illustrates a schematic configuration of a ripple control circuit of FIG. 1.

FIG. 4 is a circuit diagram illustrating a schematic configuration of a ripple control circuit of FIG. 1.

As illustrated in FIG. 4, the ripple control circuit 5 includes comparators P1 to P4, an OR circuit N1, an AND circuit N2 and a flip-flop F. Here, the comparator P1 compares the ripple terminal voltage Ripple with a subtracted value of the source voltage Vbat by the head room voltage Vhr and outputs the comparison result to a set terminal S of the flip-flop F. The comparator P2 compares the ripple terminal voltage Ripple with the threshold value Vth2 and outputs the comparison result to one input terminal of the OR circuit N1. The comparator P3 compares the ripple terminal voltage Ripple with the threshold value Vth1 and outputs the comparison result to one input terminal of the AND circuit N2. The comparator P4 compares the constant level Vth3 with the source voltage Vbat and outputs the comparison result to the other input terminal of the AND circuit N2. The output terminal of the AND circuit N2 is connected to the other input terminal of the OR circuit N1 and the output terminal of the OR circuit N1 is connected to a reset terminal R of the flip-flop F.

In the case that the source voltage Vbat is lowered and the potential difference between the source voltage Vbat and the ripple terminal voltage Ripple reaches the headroom voltage Vhr, the flip-flop F is set and the control signal SC is changed to high level. Accordingly, the input coupling capacitor C1, the AC coupling capacitor C3 and the ripple capacitor C2 are to be discharged.

Meanwhile, in the case that the ripple terminal voltage Ripple is lowered and reaches the threshold value Vth2, the control signal SC is changed to low level. Accordingly, discharging from the input coupling capacitor C1, the AC coupling capacitor C3 and the ripple capacitor C2 is discontinued.

Further, in the case that the ripple terminal voltage Ripple is lowered and reaches the threshold value Vth1 and the source voltage Vbat is not below the constant level Vth3, the control signal SC is changed to low level. Accordingly, discharging from the input coupling capacitor C1, the AC coupling capacitor C3 and the ripple capacitor C2 is discontinued.

Figure 5:
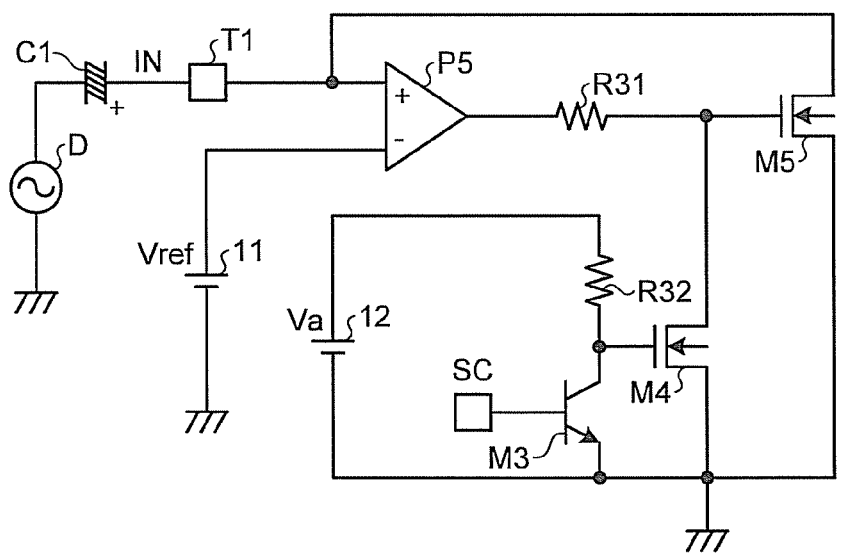
FIG. 5 is a circuit diagram which illustrates a schematic configuration of a rapid discharge circuit of FIG. 1.

FIG. 5 is a circuit diagram illustrating a schematic configuration of a rapid discharge circuit of FIG. 1.

As illustrated in FIG. 5, the rapid discharge circuit 7 includes a comparator P5, field-effect transistors M4, M5, a bipolar transistor M3, a reference voltage source 11, an access voltage source 12 and resistances R31, R32. Here, the reference voltage source 11 is capable of generating the reference voltage Vref. The reference voltage Vref may adopt the output of the ripple filter circuit 4. The access voltage source 12 is capable of generating access voltage Va. Here, the value of the access voltage Va may be set to be smaller than that of the reference voltage Vref.

One input terminal of the comparator P5 is connected to the input terminal T1 and the other input terminal of the comparator P5 is connected to the reference voltage source 11. Further, the output terminal of the comparator P5 is connected to the gate of the field-effect transistor M5 via the resistance R31. The drain of the field-effect transistor M5 is connected to the input terminal T1. Further, the collector of the bipolar transistor M3 is connected to the access voltage source 12 via the resistance R32 and is connected to the gate of the field-effect transistor M4. The drain of the field-effect transistor M4 is connected to the gate of the field-effect transistor M5. Here, the rapid discharge circuit 8 is configured to be similar to the rapid discharge circuit 7.

Then, a signal of the input signal source D is supplied to the input terminal T1 via the input coupling capacitor C1. The input terminal voltage IN supplied to the input terminal T1 is compared with the reference voltage Vref at the comparator P5. The comparison result is input to the gate of the field-effect transistor M5 via the resistance R31.

When the control signal SC generated at the ripple control circuit 5 of FIG. 4 is at low level, the bipolar transistor M3 is turned off and the gate potential of the field-effect transistor M4 is maintained at high level. Accordingly, the field-effect transistor M4 is turned on and the gate potential of the field-effect transistor M5 is maintained at low level. As a result, since the field-effect transistor M5 is turned off and the input terminal T1 is discontinued from the ground point, discharging of the input coupling capacitor C1 can be prevented regardless of the output of the comparator P5.

Meanwhile, when the control signal SC generated at the ripple control circuit 5 of FIG. 4 is at high level, the bipolar transistor M3 is turned on and the gate potential of the field-effect transistor M4 is maintained at low level. Accordingly, the field-effect transistor M4 is turned off and the gate potential of the field-effect transistor M5 varies corresponding to the output of the comparator P5. When the input terminal voltage IN exceeds the reference voltage Vref, the output of the comparator P5 is changed to high level and the field-effect transistor M5 is turned on. As a result, the input coupling capacitor C1 is discharged and the charge quantity accumulated at the input coupling capacitor C1 is controlled so that the input terminal voltage IN follows the reference voltage Vref.

Here, since the intermediate potential between the input terminals of the amplifier circuit 2 is utilized, the potential of the reference voltage Vref is lowered corresponding to the instantaneous drop of the source voltage Vbat. Accordingly, the operation point of the signal amplitude of the amplifier circuit 2 can be lowered corresponding to the instantaneous drop of the source voltage Vbat, so that the audio dropout time can be shortened.

Figure 6A:
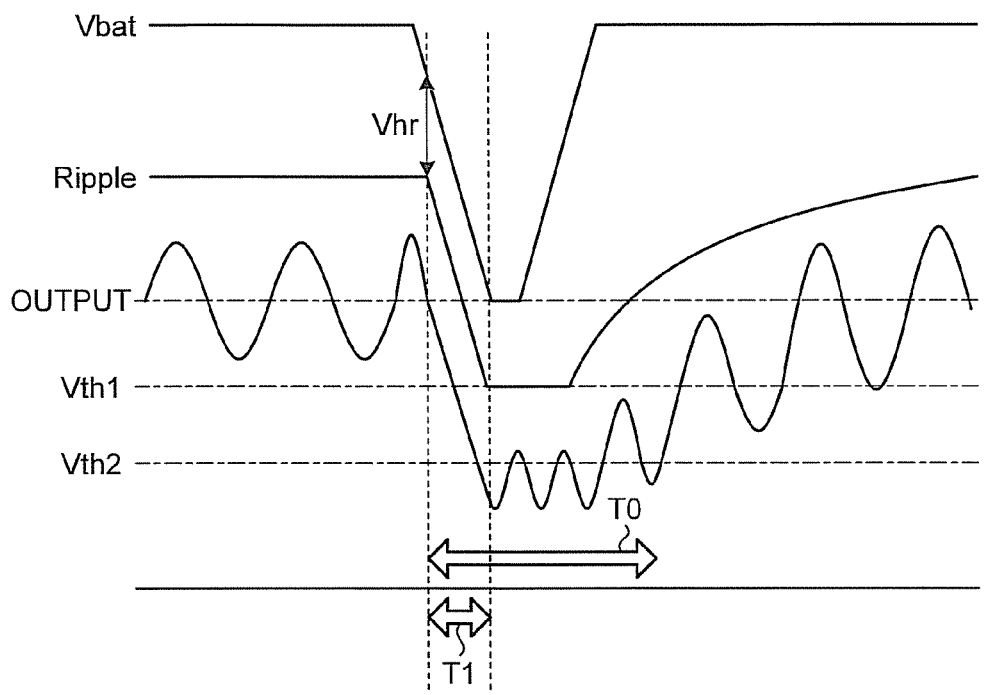
FIGS. 6A and 6B are views which illustrate relation between a threshold value of the ripple control circuit and an audio dropout term when an instantaneous drop of battery voltage occurs according to the first embodiment.
Figure 6B:
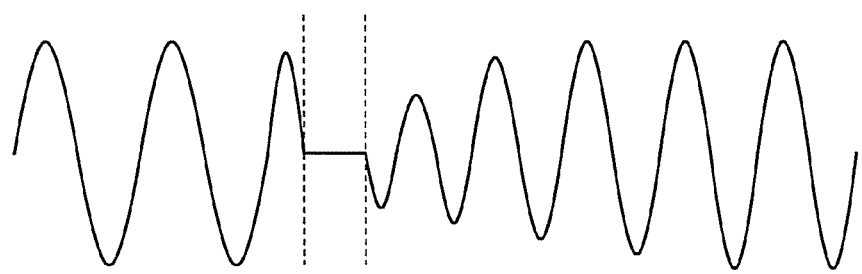
Figure 7A:
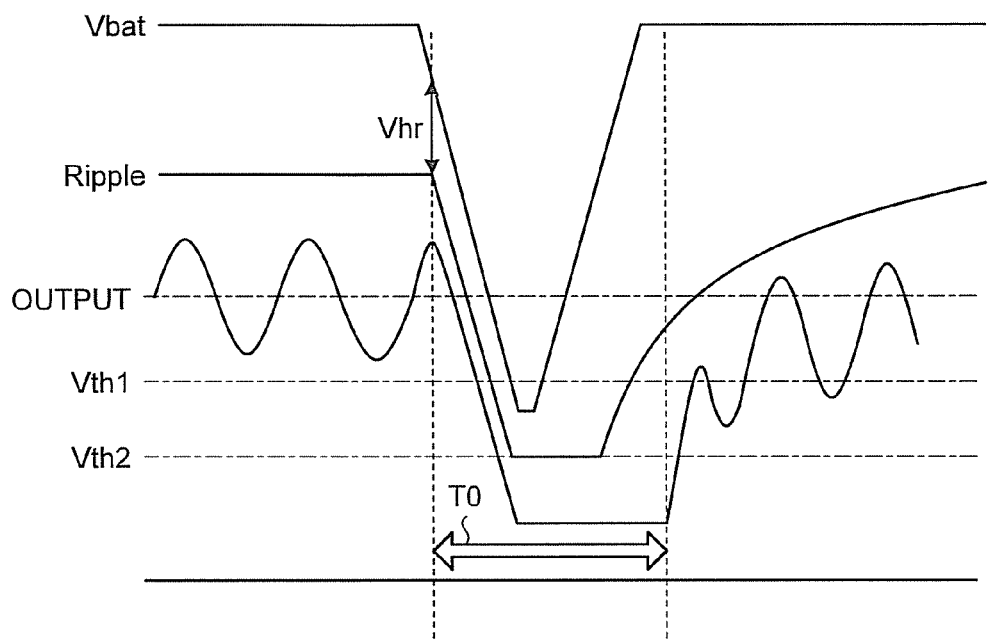
FIGS. 7A and 7B are views which illustrate relation between the threshold value of the ripple control circuit and an audio dropout term when an instantaneous drop of battery voltage occurs according to the first embodiment.
Figure 7B:
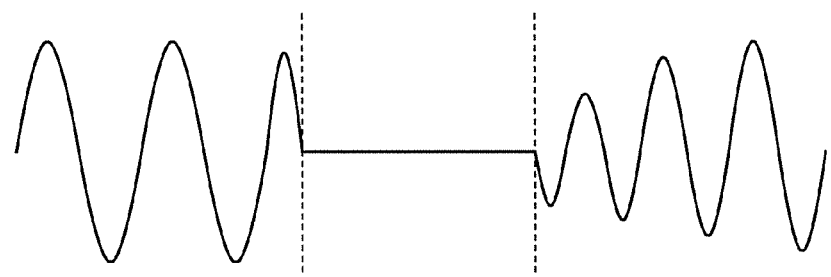

FIGS. 6A, 6B, 7A and 7B are views illustrating relation between the threshold value of the ripple control circuit and an audio dropout term when an instantaneous drop of battery voltage occurs according to the first embodiment. FIGS. 6A and 6B illustrate an example of waveforms when discharging is performed until the ripple terminal voltage Ripple reaches the threshold value Vth1. FIGS. 7A and 7B illustrate an example of a waveform when discharging is performed until the ripple terminal voltage Ripple reaches the threshold value Vth2. Here, the FIGS. 6A and 7A illustrate output waveforms at the output terminal T5 of FIG. 1. FIGS. 6B and 7B illustrate an output wave form (i.e., BTL output) between the output terminals T5, T6 of FIG. 1.

In the examples of FIGS. 6 and 7, internal muting is to be performed when the source voltage Vbat is to be in the instantaneous-drop voltage state.

With a method of the related art, when the source voltage Vbat is lowered and the potential difference between the source voltage Vbat and the ripple terminal voltage Ripple reaches the headroom voltage Vhr or lower, discharging is performed only at the ripple capacitor C2 without performing discharging at the input coupling capacitor C1 and the AC coupling capacitor C3. Accordingly, the operation point of the signal amplitude of the amplifier circuit 2 is maintained without any change. Since the operation of the amplifier circuit 2 is to be unstable, the ripple capacitor C2 is discharged to the threshold value Vth2 so that the amplifier circuit 2 is to be non-operable. Therefore, even in the case that the source voltage Vbat recovers, the ripple terminal voltage Ripple takes time to recover to be equal to or larger than a specified value and the audio dropout time TO is prolonged.

Meanwhile, with the configuration of FIG. 1, as illustrated in FIGS. 6A and 6B, when the source voltage Vbat is lowered and the potential difference between the source voltage Vbat and the ripple terminal voltage Ripple reaches the headroom voltage Vhr or lower, the input coupling capacitor C1 and the AC coupling capacitor C3 are discharged as well in addition to the discharging of the ripple capacitor C2. Accordingly, the operation point of the signal amplitude of the amplifier circuit 2 is lowered corresponding to the instantaneous drop of the source voltage Vbat. As a result, even in the case that the source voltage Vbat is in the instantaneous drop voltage state, when the source voltage Vbat is not below the constant level Vth3, the ripple capacitor C2 is discharged to the threshold value Vth1 with which the amplifier circuit 2 is operable, so that normal sound can be generated from the amplifier circuit 2. The ripple capacitor C2 is not discharged to the threshold value Vth2 with which the amplifier circuit 2 is to be non-operable as in a method of the related art, so that the audio dropout time T1 can be shortened.

Further, as illustrated in FIGS. 7A and 7B, when the source voltage Vbat is below the constant level Vth3 in the case that the source voltage Vbat is in the instantaneous-drop voltage state, the operation of the amplifier circuit 2 becomes unstable even when the operation point of the signal amplitude of the amplifier circuit 2 is lowered corresponding to the instantaneous drop of the source voltage Vbat, so that the amplifier circuit 2 can be made in a non-operable state by discharging the ripple capacitor C2 to the threshold value Vth2 with which the amplifier circuit 2 is to be non-operable.

(Second Embodiment)

Figure 8:
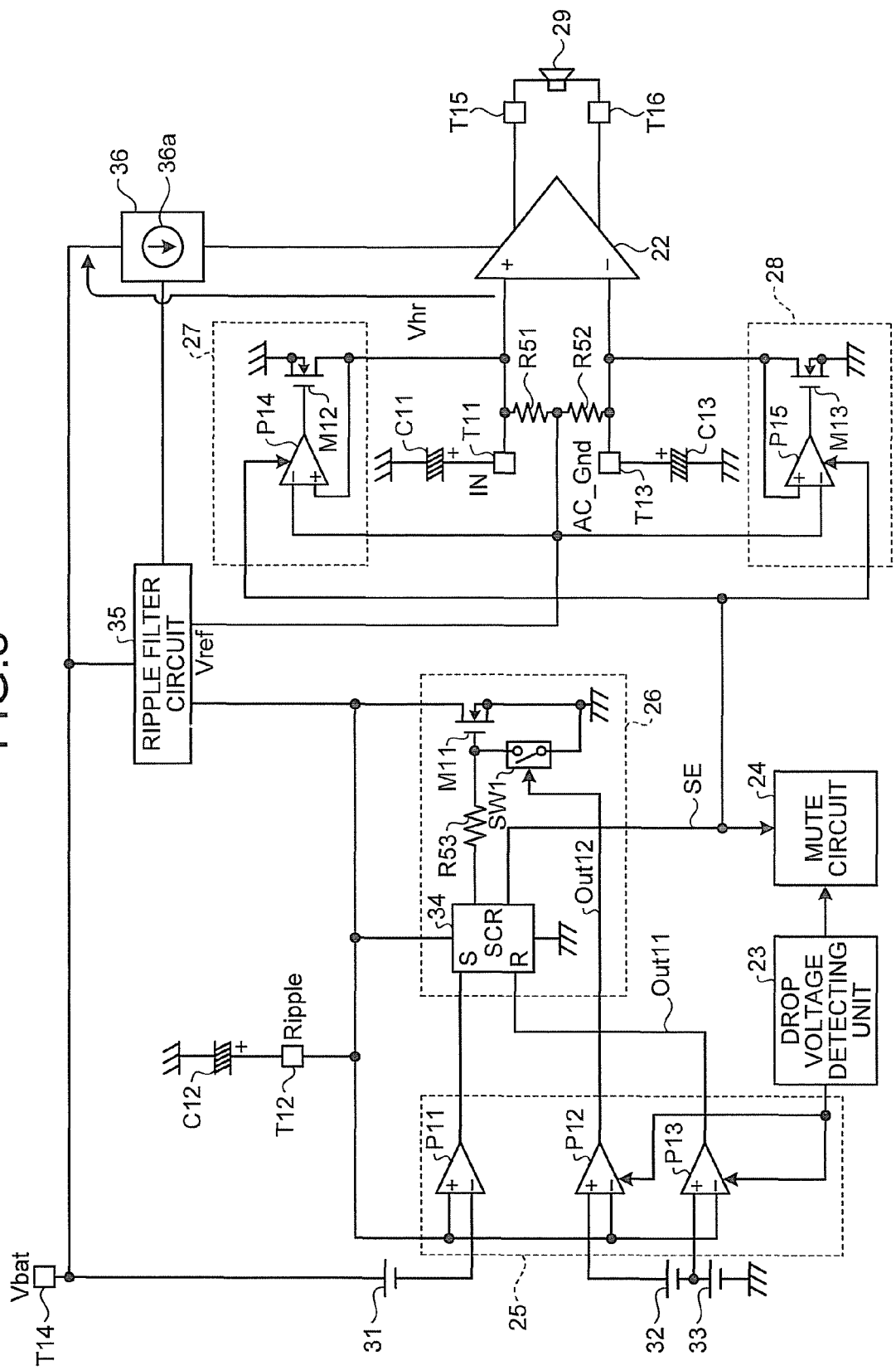
FIG. 8 is a block diagram which illustrates a schematic configuration of an amplifier according to a second embodiment.
Figure 9:
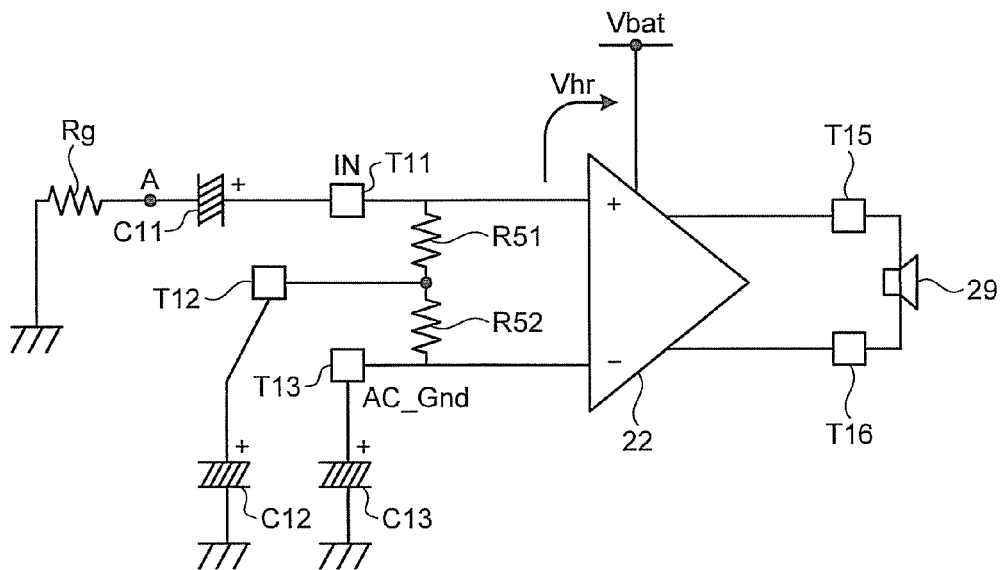
FIG. 9 is a circuit diagram which illustrates a state that a signal source impedance Rg is added to an amplifier circuit 22.

FIG. 8 is a block diagram illustrating a schematic configuration of an amplifier according to the second embodiment that is a modification example of the amplifier according to the first embodiment. FIG. 9 is a circuit diagram illustrating a state that a signal source impedance Rg is added to an amplifier circuit 22.

As illustrated in FIGS. 8 and 9, the amplifier includes the amplifier circuit 22 capable of supporting differential input. Then, an input terminal T11 and a ground terminal T13 are arranged at an input side of the amplifier circuit 22. Output terminals T15, T16 are arranged at an output side of the amplifier circuit 22. The input terminal T11 is connected to the signal source impedance Rg via an input coupling capacitor C11. The ground terminal T13 is grounded via an AC coupling capacitor C13. Further, a speaker 29 is connected between the output terminals T15, T16. A serial circuit of resistances R51, R52 is connected between the input terminal T11 and the ground terminal T13, and the reference voltage Vref generated in a ripple filter circuit 35 is input to the connection point of the resistances R51, R52.

Further, the amplifier includes the ripple capacitor C12, a drop voltage detecting unit 23, a mute circuit 24, the ripple filter circuit 35, a ripple control circuit 25, a ripple discharge circuit 26 and rapid discharge circuits 27, 28.

Here, the ripple capacitor C12 is capable of accumulating charges based on the source voltage Vbat supplied via the source terminal T14. The ripple terminal T12 to output the ripple terminal voltage Ripple is arranged to the ripple capacitor C12.

The drop voltage detecting unit 23 is capable of detecting drop voltage and notifying the mute circuit 24 and the ripple control circuit 25 of the detection result. The mute circuit 24 is capable of muting the amplifier based on the drop voltage detection result by the drop voltage detecting unit 23. Further, the mute circuit 24 is capable of muting the amplifier during discharging by the ripple discharge circuit 26.

The ripple filter circuit 35 is capable of generating the reference voltage Vref based on the ripple terminal voltage Ripple of the ripple capacitor C12.

The ripple discharge circuit 26 is capable of discharging charges accumulated at the ripple capacitor C12 while varying discharge speed from high speed to low speed at some midpoint. Here, the ripple discharge circuit 26 includes an SCR circuit 34, a field-effect transistor M11, a switch SW1 and a resistance R53. Then, a discharge terminal of the SCR circuit 34 is connected to the ripple terminal T12 and an output terminal of the SCR circuit 34 is connected to the gate of the field-effect transistor M11 via the resistance R53. The drain of the field-effect transistor M11 is connected to the ripple terminal T12. The switch SW1 is connected between the gate and source of the field-effect transistor M11. A control signal SE output from the SCR circuit 34 is input to the mute circuit 24 and the rapid discharge circuits 27, 28.

The rapid discharge circuit 27 is capable of discharging charges accumulated at the input coupling capacitor C11 based on the control signal SE output from the ripple discharge circuit 26. Here, the rapid discharge circuit 27 includes a comparator P14 and a field-effect transistor M12. The reference voltage Vref is input to an inverted input terminal of the comparator P14. A non-inverted input terminal of the comparator P14 is connected to the drain of the field-effect transistor M12 and the input terminal T11. An output terminal of the comparator P14 is connected to the gate of the field-effect transistor M12.

The rapid discharge circuit 28 is capable of discharging charges accumulated at the AC coupling capacitor C13 based on the control signal SE output from the ripple discharge circuit 26. Here, the rapid discharge circuit 28 includes a comparator P15 and a field-effect transistor M13. The reference voltage Vref is input to an inverted input terminal of the comparator P15. A non-inverted input terminal of the comparator P15 is connected to the drain of the field-effect transistor M13 and the ground terminal T13. An output terminal of the comparator P15 is connected to the gate of the field-effect transistor M13.

The ripple control circuit 25 is capable of controlling discharge timing by the ripple discharge circuit 26 based on the potential difference between the source voltage Vbat and the ripple terminal voltage Ripple. Further, the ripple control circuit 25 is capable of switching discharge speed of the ripple discharge circuit 26 from high speed to low speed at some midpoint based on the detection result of the ripple terminal voltage Ripple.

Here, the ripple control circuit 25 includes comparators P11 to P13. An inverted input terminal of the comparator P11 is connected to the source terminal T14 via an access voltage source 31. A non-inverted input terminal of the comparator P11 is connected to the ripple terminal T12. An inverted input terminal of the comparator P12 is connected to the ripple terminal T12. The non-inverted input terminal of the comparator P12 is grounded sequentially via access voltage sources 32, 33. An inverted input terminal of the comparator P13 is connected to the ripple terminal T12. A non-inverted input terminal of the comparator P13 is grounded via the access voltage source 33.

Here, the access voltage of the access voltage source 31 may be set to the head-room headroom voltage Vhr of the amplifier circuit 22. The access voltage of the access voltage source 32 may be set to $\Delta V$. The access voltage of the access voltage source 33 may be set to Vth1.

Moreover, the amplifier includes a bias circuit 36 to generate bias to operate the amplifier circuit 22, and the bias circuit 36 is provided with a current source 36a.

Then, in the ripple filter circuit 35, the source voltage Vbat is divided and the divided voltage is supplied to the ripple terminal T12, so that the ripple capacitor C12 is charged and discharged. Then, the ripple terminal voltage Ripple is generated based on the charges accumulated at the ripple capacitor C12. Then, in the ripple filter circuit 35, the reference voltage Vref is generated from the ripple terminal voltage Ripple and output to the connection point of the resistances R51, R52 and the inverted input terminals of the comparators P14, P15.

Further, the input coupling capacitor C11 is charged and discharged based on the direct-current bias applied to the input terminal T11. Due to charging and discharging of the AC coupling capacitor C13 at the same timing with the input coupling capacitor C11, fluctuation of the direct-current bias is compensated.

Further, a subtracted value of the source voltage Vbat by the headroom voltage Vhr is compared with the ripple terminal voltage Ripple at the comparator PII. Then, when the source voltage Vbat is lowered and the potential difference between the source voltage Vbat and the ripple terminal voltage Ripple reaches the headroom voltage Vhr, the SCR circuit 34 is set and the ripple capacitor C12 is discharged via the SCR circuit 34.

When the source voltage Vbat is lowered and the potential difference between the source voltage Vbat and the ripple terminal voltage Ripple reaches the headroom voltage Vhr, the field-effect transistor M11 is turned on via the SCR circuit 34 and the ripple capacitor C12 is discharged via the field-effect transistor M11. Accordingly, the discharging of the ripple capacitor C12 is accelerated.

Further, when the source voltage Vbat is lowered and the potential difference between the source voltage Vbat and the ripple terminal voltage Ripple reaches the headroom voltage Vhr, the control signal SE is output from the SCR circuit 34 to the mute circuit 24 and the rapid discharge circuits 27, 28. Then, when the control signal SE is output to the mute circuit 24, the mute circuit 24 is operated and the amplifier is muted.

Further, when the control signal SE is output to the mute circuit 24, the comparators P14, P15 are operated. Then, comparison between the reference voltage Vref and the input terminal voltage IN is performed at the comparator P14. When the input terminal voltage IN is larger than the reference voltage Vref, the field-effect transistor M12 is turned on and the input coupling capacitor C11 is discharged so that the input terminal voltage IN follows decrease of the ripple terminal voltage Ripple.

Further, comparison between the reference voltage. Vref and ground terminal voltage AC_Gnd is performed at the comparator P15. When the ground terminal voltage AC_Gnd is larger than the reference voltage Vref, the field-effect transistor M13 is turned on and the AC coupling capacitor C13 is discharged so that the ground terminal voltage AC_Gnd follows decrease of the ripple terminal voltage Ripple.

Further, comparison between the ripple terminal voltage Ripple and Vth1+$\Delta V$ is performed at the comparator P12. Then, when the ripple terminal voltage Ripple is lowered and reaches Vth1+$\Delta V$, the field-effect transistor M11 is turned off as the switch SW1 is switched on. Accordingly, discharging of the ripple capacitor C12 via the field-effect transistor M11 is discontinued, so that the discharge speed of the ripple capacitor C12 is switched from high speed to low speed.

Further, comparison between the ripple terminal voltage Ripple and Vth1 is performed at the comparator P13. Then, when the ripple terminal voltage Ripple is lowered and reaches Vth1, discharging of the ripple capacitor C12 is discontinued due to reset of the SCR circuit 34. When the SCR circuit 34 is reset, the operation of the mute circuit 24 is discontinued and the amplifier is released from muting. Further, when the SCR circuit 34 is reset, the operation of the comparators P14, P15 is discontinued. Accordingly, discharging of the input coupling capacitor C11 and the AC coupling capacitor C13 is discontinued.

Here, by switching the discharge speed of the ripple capacitor C12 from high speed to low speed, pop noise can be decreased even in the case that the input terminal voltage IN is raised by the voltage due to the signal source impedance Rg from the ground terminal voltage AC_Gnd immediately after the amplifier is released from muting.

Figure 10:
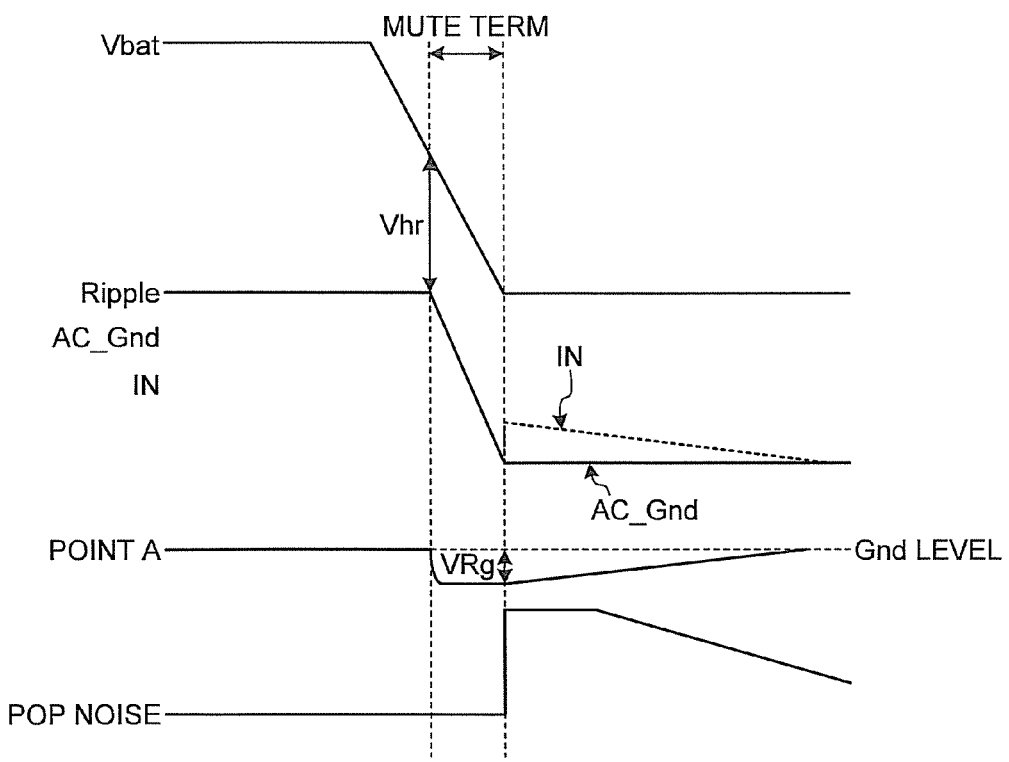
FIG. 10 is a timing chart which illustrates a state of pop noise occurrence at the time of mute releasing with the amplifier circuit 22 of FIG. 9.

FIG. 10 is a timing chart illustrating a state of pop noise occurrence at the time of mute releasing with the amplifier circuit 22 of FIG. 9.

As illustrated in FIG. 10, when the source voltage Vbat is lowered, it is required to maintain the headroom voltage Vhr in order to continue to output audio as long as possible. Accordingly, the ripple discharge circuit 26 and the rapid discharge circuits 27, 28 are activated, so that the ripple terminal voltage Ripple, the input terminal voltage IN and the ground terminal voltage AC_Gnd are lowered and the headroom voltage Vhr is ensured.

Here, the input coupling capacitor C11 and the signal source impedance Rg are connected to the input terminal T11, while the ripple capacitor C12 is connected to the ripple terminal T12 and the AC coupling capacitor C13 is connected to the ground terminal T13.

When the source voltage Vbat is lowered, the input terminal voltage IN and the ground terminal voltage AC_Gnd are lowered so as to follow the ripple terminal voltage Ripple. At that time, since discharge current flows through the signal source impedance Rg connected to the input terminal T11, voltage drop VRg occurs.

When the ripple terminal voltage Ripple is lowered to a certain value, muting releasing is performed. At that time, the input terminal T11 and the ground terminal T13 are to be in a state of being disconnected from the ripple terminal T12. Accordingly, the input terminal voltage IN is raised from the ground terminal voltage AC_Gnd by the amount of voltage drop VRg occurred at the signal source impedance Rg immediately after the mute releasing. That is, offset is to be generated between the input terminals of the amplifier circuit 22. Large pop noise occurs as the offset amount is amplified.

Figure 11:
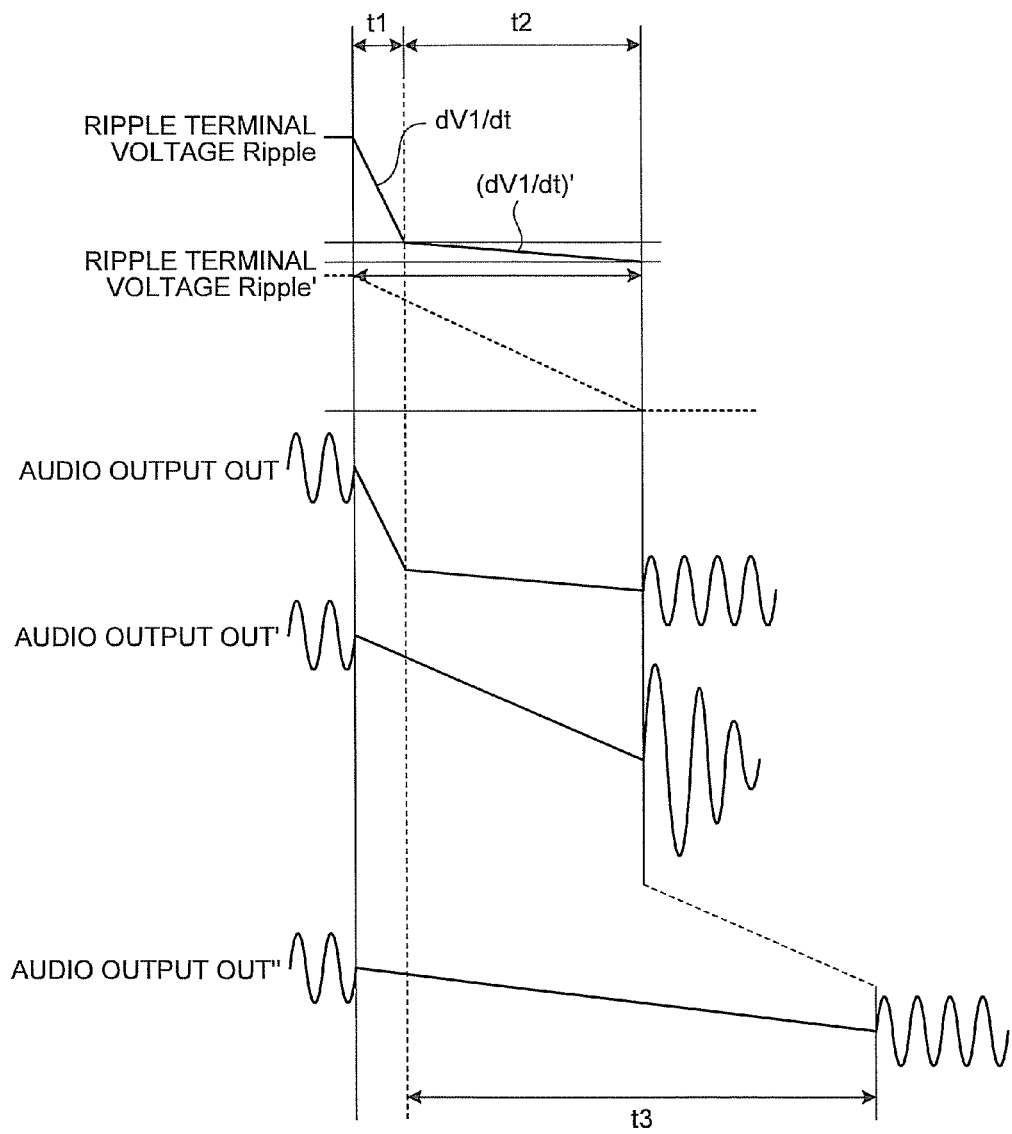
FIG. 11 is a timing chart which illustrates variation of ripple voltage in a mute term of the amplifier circuit 22 of FIG. 9 in comparison with that in the related art.

FIG. 11 is a timing chart illustrating variation of ripple voltage in a muting term of the amplifier circuit 22 of FIG. 9 in comparison with that in the related art.

As illustrated in FIG. 11, as the field-effect transistor M11 is kept on until the ripple terminal voltage Ripple is lowered and reaches V1$th$+ΔV and the field-effect transistor M11 is kept off after the ripple terminal voltage Ripple reaches Vth1+ΔV until reaching Vth1, the ripple capacitor C12 can be discharged at high speed in a period t1 from the mute starting point to some midpoint and can be discharged at low speed in a period t2 from the mute midpoint to the release point.

In this manner, the ripple terminal voltage Ripple can be lowered as following the decrease of the source voltage Vbat. Accordingly, the headroom voltage Vhr can be ensured and muting releasing can be performed in a state that the input terminal voltage IN is 0 V. Therefore, pop noise can be decreased while shortening the audio dropout time and the audio output OUT can be restarted while suppressing uncomfortable feeling.

Meanwhile, when the ripple terminal voltage Ripple' is lowered with a constant gradient over the period t1+t2, the gradient of the ripple terminal voltage Ripple' immediately before mute releasing becomes large, so that large pop noise occurs with the audio output OUT' of that time.

Alternately, when the gradient of the ripple terminal voltage Ripple' immediately before mute releasing is lessened as keeping the gradient of the ripple terminal voltage Ripple' at constant, muting is performed over the period t1+t3. Accordingly, it takes time until the audio output OUT" is restarted, so that the audio dropout time is prolonged.

Figure 12:
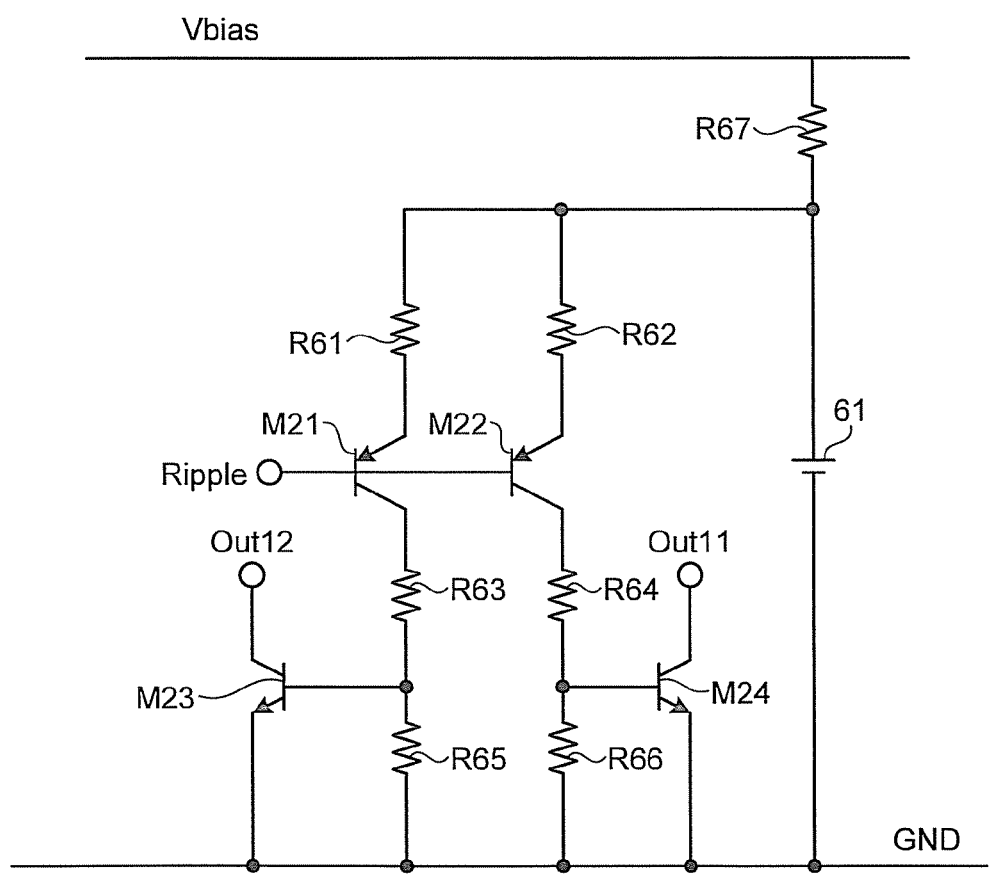
FIG. 12 is a circuit diagram which illustrates an example of comparators P12, P13 of FIG. 8.

FIG. 12 is a circuit diagram illustrating an example of the comparators P12, 213 of FIG. 8.

As illustrated in FIG. 12, bipolar transistors M21 to M24 and resistances R61 to R67 are arranged respectively to the comparators 212, P13. Here, the bias potential Vbias is connected to the positive electrode side of an access voltage source 61 via the resistance R67.

The collector of the bipolar transistor M21 is grounded sequentially via the resistances R63, R65. The emitter of the bipolar transistor M21 is connected to the positive electrode side of the access voltage source 61 via the resistance R61. The collector of the bipolar transistor M22 is grounded sequentially via the resistances R64, R66. The emitter of the bipolar transistor M22 is connected to the positive electrode side of the access voltage source 61 via the resistance R62. Here, Vth1 and ΔV of FIG. 8 can be set by adjusting the values of the resistances R61, R62.

The connection point of the resistances R63, R65 is connected to the base of the bipolar transistor M23. The connection point of the resistances R64, R66 is connected to the base of the bipolar transistor M24. The emitters of the bipolar transistors M23, M24 are grounded. The ripple terminal voltage Ripple is input to the bases of the bipolar transistors M23, M24.

When the ripple terminal voltage Ripple is lowered, the bipolar transistor M21 is turned on and electric current flows through the resistances R63, R65. Accordingly, voltage drop occurs at the resistance R65. When the voltage drop at the resistance R65 is below a predetermined value, the bipolar transistor M23 is turned on and output Out12 is lowered.

When the ripple terminal voltage Ripple is further lowered, the bipolar transistor M22 is turned on and electric current flows through the resistances R64, R66. Accordingly, voltage drop occurs at the resistance R66. When the voltage drop at the resistance R66 is below a predetermined value, the bipolar transistor M24 is turned on and output Out11 is lowered.

Figure 13:
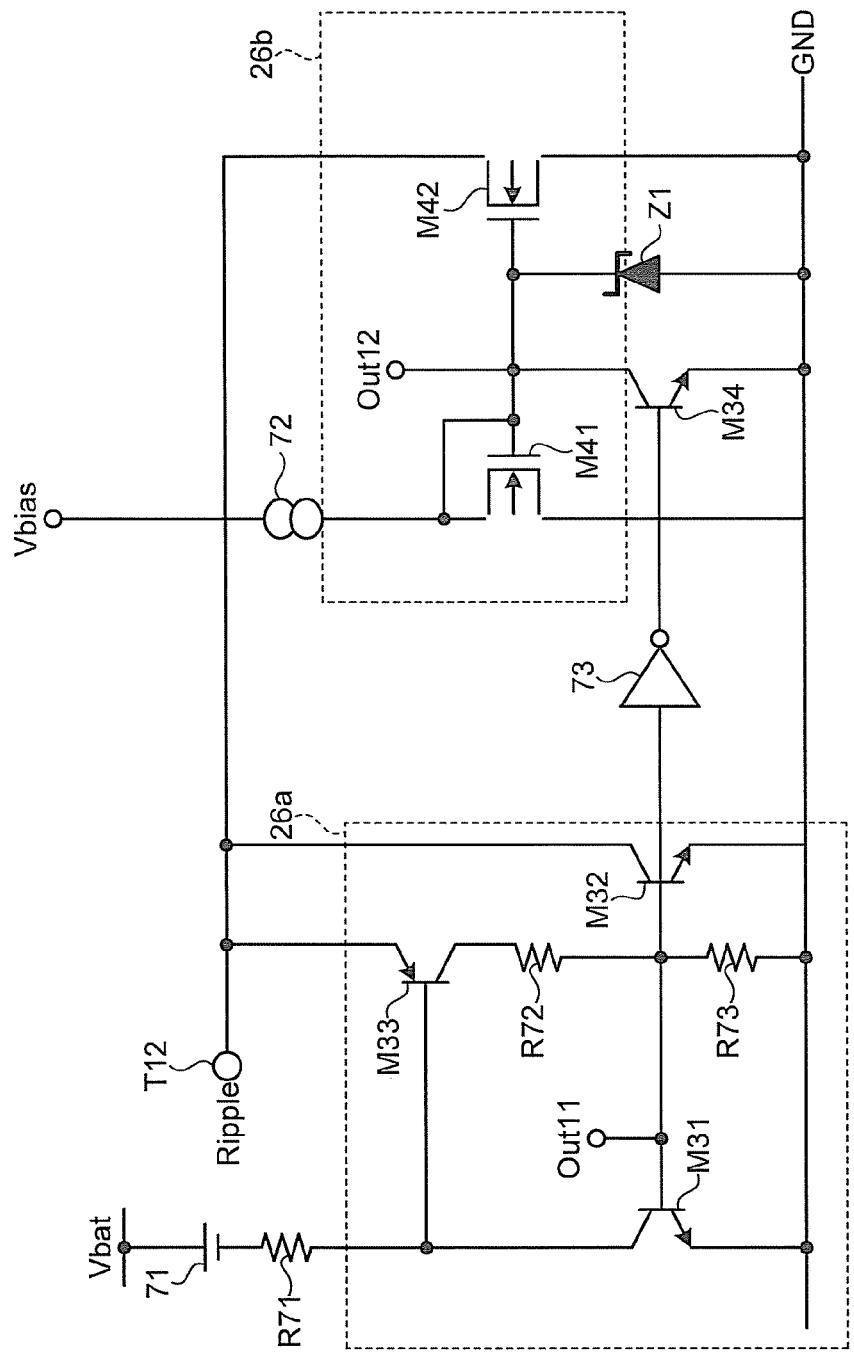
FIG. 13 is a circuit diagram which illustrates an example of a ripple discharge circuit 26 of FIG. 8.

FIG. 13 is a circuit diagram illustrating an example of the ripple discharge circuit 26 of FIG. 8.

As illustrated in FIG. 13, the ripple discharge circuit 26 includes a low speed discharge circuit 26$a$ and a discharge acceleration circuit 26$b$. The low speed discharge circuit 26$a$ is capable of discharging charges accumulated at the ripple capacitor C12 at low speed. The discharge acceleration circuit 26$b$ is capable of accelerating discharging charges accumulated at the ripple capacitor C12.

Here, the low speed discharge circuit 26$a$ includes bipolar transistors M31 to M33 and resistances R72, R73. The discharge acceleration circuit 26$b$ includes field-effect transistors M41, M42.

The emitter of the bipolar transistor M33 is connected to the ripple terminal T12. The collector of the bipolar transistor M33 is grounded sequentially via the resistances R72, R72. The source voltage Vbat is supplied to the collector of the bipolar transistor M31 and the base of the bipolar transistor M33 sequentially via a resistance R71 and an access voltage source 71. Here, the voltage of the access voltage source 71 may be set to the headroom voltage Vhr. The bases of the bipolar transistors M31, M32 are connected to the connection point of the resistances R72, R73. The collector of the bipolar transistor M32 is connected to the ripple terminal T12. The emitter of the bipolar transistor M32 is grounded.

Further, the bases of the bipolar transistors M31, M32 are connected to the base of the bipolar transistor M34 via an inverter 73. The gates of the field-effect transistors M41, M42 are connected to the drain of the field-effect transistor M41. The bias voltage Vbias is supplied to the drain of the field-effect transistor M41 via an electric current source 72. The drain of the field-effect transistor M42 is connected to the ripple terminal T12.

Further, the gates of the field-effect transistors M41, M42 are grounded via the bipolar transistor M34. A zener diode Z1 is connected to the bipolar transistor M34 in parallel. Here, the field-effect transistors M41, M42 constitutes a current mirror. Drive force of the field-effect transistor M41 can be set at N times (N is a real number being larger than 1) larger than that of the field-effect transistor M42.

Then, the output Out11 of the comparator P13 is input to the bases of the bipolar transistors M31, M32. The output Out12 of the comparator P12 is input to the gates of the field-effect transistors M41, M42.

When the source voltage Vbat is lowered and the potential difference between the source voltage Vbat and the ripple terminal voltage Ripple reaches the headroom voltage Vhr in a state that the outputs Out12, Out11 of the respective comparators P12, P13 are at high level, the bipolar transistors M31 to M33 and the field-effect transistors M41, M42 are turned on. Further, the output Out12 of the comparator P12 is inverted at the inverter 73 and the bipolar transistor M34 is turned off. Accordingly, the ripple capacitor C12 is discharged at the low speed discharge circuit 26$a$ and the discharge acceleration circuit 26$b$, so that discharging is performed at high speed.

Next, when the output Out12 of the comparator P12 becomes low level, the field-effect transistors M41, M42 are turned off and discharging by the discharge acceleration circuit 26$b$ is discontinued. Accordingly, the ripple capacitor C12 is discharged only by the low speed discharge circuit 26$a$, so that discharging is switched to low speed.

Further, when the output Out11 of the comparator P13 becomes low level, the bipolar transistors M31, M32 are turned off and discharging by the low speed discharge circuit 26a is discontinued.

Figure 14:
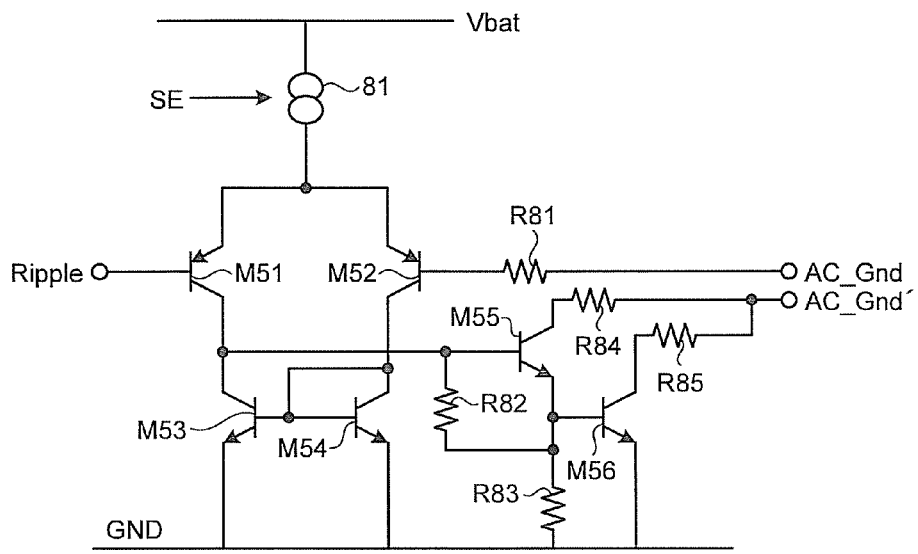
FIG. 14 is a circuit diagram which illustrates an example of a rapid discharge circuit 28 of FIG. 8.

FIG. 14 is a circuit diagram illustrating an example of the rapid discharge circuit 28 of FIG. 8. In FIG. 14, the circuit diagram of the rapid discharge circuit 28 is exemplified. Here, the rapid discharge circuit 27 can be structured similarly.

As illustrated in FIG. 14, the rapid discharge circuit 28 includes bipolar transistors M51 to M56, resistances R81 to R85 and an electric current source 81. The source voltage Vbat is supplied to the source of the bipolar transistor M51 via the electric current source 81. The emitter of the bipolar transistor M52 is connected to the emitter of the bipolar transistor M51.

The collector of the bipolar transistor M51 is connected to the collector of the bipolar transistor M53. The collector of the bipolar transistor M52 is connected to the collector of the bipolar transistor M54. The emitters of the bipolar transistors M53, M54 are grounded.

The ripple terminal voltage Ripple is input to the base of the bipolar transistor M51. The ground terminal voltage AC_Gnd is input to the base of the bipolar transistor M52 via the resistance R81. The bases of the bipolar transistors M53, M54 are connected to the collector of the bipolar transistor M54.

The ground terminal voltage AC_Gnd' is input to the collector of the bipolar transistor M55 via the resistance R84. Here, the ground terminal voltage AC_Gnd' may be set at voltage of the same potential in a separate line from the ground terminal voltage AC_Gnd.

The base of the bipolar transistor M55 is connected to the collector of the bipolar transistor M53 and the emitter of the bipolar transistor M55. The emitter of the bipolar transistor M55 is grounded via the resistance R83 and is connected to the base of the bipolar transistor M56. The ground terminal voltage AC_Gnd' is input to the collector of the bipolar transistor M56 via the resistance R85. The emitter of the bipolar transistor M56 is grounded.

When the control signal SE is input to the electric current source 81, electric current is supplied to the bipolar transistors M51, M52 via the electric current source 81. Then, when the ripple terminal voltage Ripple becomes lower than the ground terminal voltage AC_Gnd, the electric current flowing through the bipolar transistor M51 is decreased and voltage drop by the resistances R82, R83 is decreased. Accordingly, the base potential of the bipolar transistors M55, M56 is lowered and the electric current flowing through the bipolar transistors M55, M56 is decreased, so that voltage drop by the resistances R84, R85 is decreased. Therefore, the ground terminal voltages AC_Gnd', AC_Gnd are lowered and the AC coupling capacitor C13 is discharged, and then, the electric current flowing through the bipolar transistor M51 is decreased.

Figure 15:
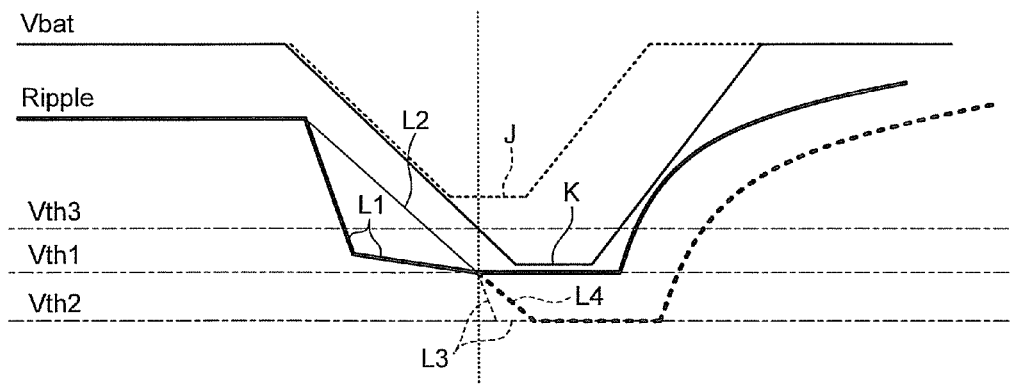
FIG. 15 is a view which illustrates relation between ripple voltage and a threshold value when an instantaneous drop of battery voltage occurs according to the first embodiment and the second embodiment.

FIG. 15 is a view illustrating relation between ripple voltage and a threshold value when an instantaneous drop of battery voltage occurs according to the first embodiment and the second embodiment.

As illustrated in FIG. 15, in the case that the source voltage Vbat is not below the constant level Vth3 when instantaneous drop of the source voltage Vbat occurs (J), the ripple capacitor C2 is discharged to the threshold value Vth1 at a constant gradient with the configuration in the first embodiment of FIG. 1 (L2).

Meanwhile, in the case that the source voltage Vbat is not below the constant level Vth3 when instantaneous drop of the source voltage Vbat occurs (J), the ripple capacitor C12 is discharged to the threshold value Vth1 as varying the gradient from a steep gradient to a slight gradient at some midpoint with the configuration in the second embodiment of FIG. 8 (L1).

Further, in the case that the source voltage Vbat is below the constant level Vth3 when instantaneous drop of the source voltage Vbat occurs (K), the ripple capacitor C2 is further discharged from the threshold value Vth1 to the threshold value Vth2 at a constant gradient with the configuration in the first embodiment of FIG. 1 (L4).

Meanwhile, in the case that the source voltage Vbat is below the constant level Vth3 when instantaneous drop of the source voltage Vbat occurs (K), the ripple capacitor C12 is further discharged from the threshold value Vth1 to the threshold value Vth2 at a gradient from a slight gradient to a steep gradient again with the configuration in the second embodiment of FIG. 8 (L3).

As the configuration for further discharging the ripple capacitor C12 to the threshold value Vth2, it is possible to add the comparator that compares the constant level Vth3 with the source voltage Vbat to the configuration in FIG. 8. Then, when the source voltage Vbat is below the constant level Vth3, the ripple discharge circuit 26 in FIG. 8 is operated, thereby enabling to perform high-rate discharge on the ripple capacitor C12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier comprising:
an amplifier circuit to support a differential input;
a ripple discharge circuit to lower ripple terminal voltage for generating reference voltage of the amplifier circuit based on a source voltage of the amplifier circuit; and
a ripple control circuit to control discharge timing by the ripple discharge circuit based on potential difference between the source voltage and the ripple terminal voltage, wherein
in a case that the source voltage is lowered and the potential difference between the source voltage and the ripple terminal voltage is below a constant potential difference, the ripple terminal voltage is lowered until the ripple terminal voltage reaches a first threshold value when a lowered value of the source voltage is equal to or larger than a predetermined voltage that exceeds the first threshold value by the constant potential difference, and the ripple terminal voltage is lowered until the ripple terminal voltage reaches a second threshold value smaller than the first threshold value when the lowered value of the source voltage is below the predetermined voltage.

2. The amplifier according to claim 1, further comprising:
a first rapid discharge circuit to lower a first input terminal voltage of the amplifier circuit; and
a second rapid discharge circuit to lower a second input terminal voltage of the amplifier circuit, wherein
the ripple control circuit controls discharge timing by the ripple discharge circuit, and the first rapid discharge circuit and the second rapid discharge circuit based on the potential difference between the source voltage and the ripple terminal voltage.

3. The amplifier according to claim 2, wherein in a case that the source voltage is lowered and the potential difference between the source voltage and the ripple terminal voltage is below the constant potential difference, a direct-current bias of input of the amplifier circuit is lowered and an operation point of signal amplitude of the amplifier circuit is lowered by lowering the ripple terminal voltage, and the first input terminal voltage and the second input terminal voltage of the amplifier circuit.

4. The amplifier according to claim 1, wherein the constant potential difference is headroom voltage of the amplifier circuit.

5. The amplifier according to claim 1, wherein
the amplifier circuit is capable of being operated with the first threshold value, and
the amplifier circuit is to be non-operable with the second threshold value.

6. The amplifier according to claim 1, wherein
the ripple control circuit includes
a first comparator to compare the ripple terminal voltage with a value of the source voltage subtracted from the head room voltage,
a second comparator to compare the ripple terminal voltage with the second threshold value,
a third comparator to compare the ripple terminal voltage with the first threshold value,
a fourth comparator to compare a third threshold value with the source voltage,
a first OR circuit to obtain logical addition of output of the third comparator and output of the fourth comparator,
a second OR circuit to obtain logical addition of output of the second comparator and output of the first OR circuit, and
a flip-flop to be set with output of the first comparator and to be reset with output of the second OR circuit.

7. The amplifier according to claim 1, further comprising a ripple filter circuit to generate the reference voltage of the amplifier circuit based on the ripple terminal voltage.

8. The amplifier according to any one of claims 2 to 7, wherein
the first rapid discharge circuit includes
a comparator to perform comparison between the first input terminal voltage and the reference voltage,
a first transistor to lower the first input terminal voltage based on output of the comparator, and
a second transistor to fix output of the comparator so that the first transistor is turned off based on output of the ripple control circuit.

9. The amplifier according to claim 1, wherein in a case that the source voltage is lowered and the potential difference between the source voltage and the ripple terminal voltage is below the constant potential difference, a rate of decline of the ripple terminal voltage is varied from high speed to low speed at some midpoint during lowering the ripple terminal voltage until the ripple terminal voltage reaches the first threshold value.

10. The amplifier according to claim 1, wherein
the ripple charge circuit includes
a low speed discharge circuit to lower the ripple terminal voltage at low speed, and
a discharge acceleration circuit to accelerate lowering of the ripple terminal voltage.

11. The amplifier according to claim 10, wherein
the ripple control circuit includes
a first comparator to start discharging of the low speed discharge circuit and the discharge acceleration circuit based on potential difference between the source voltage and the ripple terminal voltage,
a second comparator to discontinue discharging of the discharge acceleration circuit based on a comparison result between the ripple terminal voltage and a first access voltage, and
a third comparator to discontinue discharging of the low speed discharge circuit based on a comparison result between the ripple terminal voltage and a second access voltage being smaller than the first access voltage.

12. The amplifier according to claim 1, wherein the amplifier circuit is a power amplifier for a car audio system and the source voltage is voltage of a car battery.

13. The amplifier according to claim 1, wherein a first input terminal of the amplifier circuit is connected to an input signal source via a first coupling capacitor and a second input terminal of the amplifier circuit is grounded via a second coupling capacitor.

14. The amplifier according to claim 13, wherein the first coupling capacitor is charged and discharged corresponding to direct-current bias applied to the first input terminal and the second coupling capacitor is charged and discharged at the same timing as the first coupling capacitor.

15. The amplifier according to claim 1, wherein
in a case that the source voltage is lowered and the potential difference between the source voltage and the ripple terminal voltage is below the constant potential difference, output of the amplifier circuit is muted and the ripple terminal voltage is lowered until reaching the first threshold value with which the amplifier circuit is operable, and
if the source voltage is equal to or larger than the predetermined voltage when the ripple terminal voltage is lowered to the first threshold value, mute of the output of the amplifier circuit is released.

16. An amplifier comprising:
an amplifier circuit to support a differential input;
a ripple discharge circuit to lower ripple terminal voltage;
a first rapid discharge circuit to lower a first input terminal voltage of the amplifier circuit;
a second rapid discharge circuit to lower a second input terminal voltage of the amplifier circuit; and
a ripple control circuit to control discharge timing by the ripple discharge circuit, and the first rapid discharge circuit and the second rapid discharge circuit based on potential difference between a source voltage and the ripple terminal voltage.

17. The amplifier according to claim 16, wherein in a case that the source voltage is in an instantaneous-drop voltage state, a direct-current bias of input of the amplifier circuit is lowered and an operation point of signal amplitude of the amplifier circuit is lowered by lowering the ripple terminal voltage, and the first input terminal voltage and the second input terminal voltage of the amplifier circuit.

18. The amplifier according to claim 17, wherein in a case that the source voltage is lowered within a range that operation of the amplifier circuit does not become unstable, the ripple terminal voltage is lowered within a range that the amplifier circuit is operable.

19. The amplifier according to claim 18, wherein in a case that the source voltage is lowered until operation of the amplifier circuit becomes unstable, the ripple terminal voltage is lowered so that the amplifier circuit is to be non-operable.

20. The amplifier according to claim 16, wherein a rate of decline of the ripple terminal voltage is varied from high speed to low speed at some midpoint.

\* \* \* \* \*